United States Patent [19]

Stone

[11] 4,135,951

[45] Jan. 23, 1979

[54] ANNEALING METHOD TO INCREASE MINORITY CARRIER LIFE-TIME FOR NEUTRON TRANSMUTATION DOPED SEMICONDUCTOR MATERIALS

[75] Inventor: Bobbie B. Stone, Ballwin, Mo.

[73] Assignee: Monsanto Company, St. Louis, Mo.

[21] Appl. No.: 806,137

[22] Filed: Jun. 13, 1977

[51] Int. Cl.² .................................. H01L 21/263
[52] U.S. Cl. ................................. 148/1.5; 357/91
[58] Field of Search ......................... 148/1.5; 357/91

[56] References Cited

U.S. PATENT DOCUMENTS 3,914,138  10/1975  Rai-Choudhary et al. .......... 148/186

OTHER PUBLICATIONS

M. Hill, et al., "Prep-ⁿ· . . . of NTD Silicon for Power Device Research", IEEE Trans., vol. ED-23, Aug., 1976, p. 809.

H. M. Janus, et al., "Appl-ⁿ· of Thermal Neutron Irradiation . . . P-Doping of FZ-Si", IEEE Trans., ED-23, (1976), 797.

Primary Examiner—L. Dewayne Rutledge
Assistant Examiner—Upendra Roy
Attorney, Agent, or Firm—Henry Croskell

[57] ABSTRACT

Semiconductor materials which have been doped by neutron transmutation require annealing at high temperatures in order to alleviate radiation damage and to restore electrical resistivity; however, the minority carrier lifetime is reduced significantly through the irradiation and/or the annealing process. A method for increasing the minority carrier lifetime while maintaining the restored electrical resistivity is achieved by cooling the heated annealed materials at a cooling rate less than about 4° C. per minute and preferably less than about 3° C. per minute to ambient temperatures.

10 Claims, No Drawings

ANNEALING METHOD TO INCREASE MINORITY CARRIER LIFE-TIME FOR NEUTRON TRANSMUTATION DOPED SEMICONDUCTOR MATERIALS

FIELD OF THE INVENTION

The present invention relates to a method for restoring neutron doped semiconductor material resistivity and increasing the minority carrier lifetime of said material through controlled cooling following annealing.

BACKGROUND OF THE INVENTION

The manufacturers of semiconductor devices often demand phosphorus doped single crystal material having a very tight tolerance for average resistivity with a distribution of the dopant as homogeneous as possible. The manufacturers of high-blocking thyristors are interested in such materials because it effects an optimization of the device properties. In contrast to conventional doping methods, it is possible to accomplish the desired doping conditions by means of neutron irradiation. The exact resistivity value can be obtained within an extremely narrow limit and the material is practically free from the macroscopic and the microscopic variations of the electrical resistivity observed in conventionally doped semiconductor materials.

Neutron transmutation doping is the nuclear conversion of semiconductor materials atoms into dopant, i.e., silicon atoms into phosphorus dopant atoms by exposing undoped silicon crystals to a suitable flux of thermal neutrons in the core of a nuclear reactor. The nuclear reaction involved is:

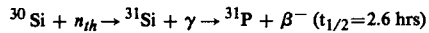

$$^{30}Si + n_{th} \rightarrow {}^{31}Si + \gamma \rightarrow {}^{31}P + \beta^- \quad (t_{1/2}=2.6 \text{ hrs})$$

The advantage of this technique is the chance to fabricate N-doped silicon of extreme homogenity which is impossible to realize by conventional doping methods.

Most commercial uses of semiconductor materials require single crystals of very accurately controlled resistivity. In certain instances, this requirement arises from the nature of the semiconductor devices, i.e., the avoidance of marked resistivity variation affecting electrical characteristics. In others, when the device does not give rise to this requirement, characteristics of the starting material may determine the position and nature of junctions and gradients produced during manufacture, so that initially uniform properties in the starting material are necessary.

In most semiconductor materials, constant resistivity is not easily obtained. The distribution coefficients for most significant impurities in, for example, silicon and the increased activity of silicon at its high melting point complicates the problem. Uniform P-type silicon has been produced by either of two methods. Using boron with a distribution coefficient of approximately 0.9, uniform crystals have been produced by crystal pulling. Using the float zone technique with aluminum, having a distribution coefficient of 0.004 P-type silicon of a high degree of uniformity has been produced by zone leveling.

The preparation of uniform resistivity N-type silicon has been a more difficult problem. The usual doping impurities of group V of the periodic table do not lend themselves to use in conventional processing techniques. Certain of these impurities, such as antimony, are sufficiently volatile at the melting point of silicon that it is difficult to control their concentration during the usual crystal growing procedures. The less volatile group V impurities, phosphorus and arsenic, have distribution coefficients which are two small to permit their use in crystal pulling or their use in zone leveling procedures.

Phosphorus has been the group V element preferred for the doping of semiconductor grade silicon to give "N" type electron conductivity, especially for high resistivity materials for power devices. Since the segregation coefficient of phosphorus is relatively low (0.35), a non-planar feeezing interface during the growth of mono-crystals by the float zone process will cause a non-uniform radial distribution of phosphorus in the crystal. Since the center freezes last it will contain more dopant than the edge. Minimizing this non-uniformity, the consequence of which is usually referred to as radial resistivity gradients, has been a goal of research in the zone-refining process. In the past few years, development of the spreading resistance probe method for measuring resistivity has revealed that numerous micro non-homogenities exist in addition to the macro variations revealed by radial gradient measurements. It is generally agreed that the variations in dopant concentration in the crystal lattice play a major role in limiting the performance obtainable in high power silicon devices and in reducing the yield in device manufacturing process.

The crystal damage which is produced during neutron bombardment can be classified by the different types of neutron generation mechanisms. Depending upon the specific reactor performances, a different annealing behavior can be observed. This dependence is correlated with the amount of fast neutrons and can be explained by the increased number of high energetic collisions participating.

From the view of large scale production, various aspects have to be considered like limitations due to residual radioactivity, reactor performances, irradiation capacity, requirements of the starting material, and annealing treatment. It being understood that exposure of a semiconductor crystal to a neutron flux and other radiation within a reactor may produce damage in the crystalline material in the form of a disorder of a crystalline irregularity on a common scale, it will, however, be appreciated that such radiation-produced defects can be cured through annealing by appropriate heating for a specified time length at temperatures within the range of from about 500°–600° C. to higher temperatures below the melt temperature of the semiconductor crystalline material. The annealing has no effect with respect to neutron transmutation-produced nuclides, but results in the removal of radiation damage defects through restoration of crystal symmetry and order. This restoration procedure restores the electrical resistivity to the level corresponding to the dopant-content i.e., in the case of silicon to the corresponding level phosphorus content.

Annealing of the neutron transmutation semiconductor material restores resistivity; however, the minority carrier lifetime is reduced by a significant amount. Even though existing annealing techniques allow restoring of a crystal lattice radiation defect to the extent that the impurity versus resistivity relation is not distinguishable from that of melt doped silicon, i.e., no difference exists between application of neutron and melt-doped silicon apart from the significantly improved doping uniformity, a significant drop in minority carrier lifetime is observed in the case of neutron doping.

SUMMARY OF THE INVENTION

According to the method of the invention, the minority carrier lifetime of neutron transmutation doped semiconductor material is a function of the thermal cycle. After the radiation-produced defects are cured through annealing by appropriate heating for specific time lengths at temperatures from about 500°–600° C. through temperatures below the melt temperature of the semiconductor material, resistivity is restored; however, when these materials are allowed to be drawn rapidly from the heating chamber to ambient temperature zones, typically lifetimes obtained are significantly less than those obtained when the annealed sample is cooled under controlled conditions at a cooling rate of less than about 4° C. per minute. A method is herein presented for increasing the minority carrier lifetime while maintaining restored electrical resistivity of annealed, neutron transmutation doped semiconductor material by cooling the annealed materials at a cooling rate less than about 4° C. per minute to ambient temperatures of less than about 200° C.

The method comprises first producing for example, float zone or Czochralski crystals of silicon, undoped in rod form. The rod crystalline material is then cleaned for removal of contamination material and sent to the reactor facilities for radiation. Upon receipt from the reactor facility the irradiated material is again cleaned with etching acid mixtures and annealed at temperatures at from about 600° to about 1300° C. for period of at least about one-fourth hour up to four or five hours or more. Crystalline damage incurred by the crystal during irradiation provides trapping centers that causes resistivity to increase non-reproducably to a level not related to the free carrier concentration. Annealing at, for example 800° C. for at least one hour eliminates the defects. The purpose of the annealing step then, is to restore the resistivity to a stable value determined by the net carrier concentration. To provide a margin of certainty, a cycle calling for about three hours at about 800° C. was used for the examples of Tables II and III. The comparative examples and those examples according to the invention were annealed under the same conditions; however, controlled thermal cycle cool-down achieved increased minority carrier lifetimes.

DESCRIPTION OF THE PREFERRED EMBODIMENT

The invention provides a method of reliably and simply restoring neutron-doped semiconductor material resistivity while increasing the minority carrier lifetime of said material through annealing followed by a cool down rate of preferably from about ¼° C. to about 3° C. per minute to an ambient temperature of less than about 200° C. As will be seen from the examples, when the annealed samples were cooled without control from the 800° C. zone to an ambient temperature zone, typical minority carrier lifetime values obtained were in the 75 to 100μ second range; however, when similar samples were cooled at the controlled rate of 2°–3° C. per minute from 800° C. to about 200° C. typical minority carrier lifetime values were in the 175–200μ seconds range.

The cool down cycle according to the invention must necessarily go below for example 500° C. Preferably the cool down cycle extends to below about 300° C. in order to achieve desired increase in minority carrier lifetime. For example, this increase is not observed if the cool down cycle does not go below 550° C. The minority carrier lifetime increase is not achieved if the cool down rate is greater than about 4° C. per minute, therefore the invention provides a method for restoring neutron-doped semiconductor material resistivity and increasing the minority carrier lifetime of said material through annealing, comprising: heating the material to an annealing temperature of around 600° C. or greater, but below the material melting temperature for a period of from one-fourth hour to about five hours or more; and cooling the heated material from the annealing temperature to ambient temperature of below about 200° C. at a cooling rate of from ¼° C. to about 3° C. per minute.

The selection of the starting material is of importance since one of the fundamental limitations in the fabrication of high voltage devices, is the inhomogeneities in the doping of the bulk semiconductor crystal. On the rods or ingots as well as in the annealing enclosure cleanliness must be of a high order to achieve reproducible results. At elevated temperatures, semiconductor materials are much more susceptible to the diffusion of heavy metals and very small quantities can decrease the minority carrier lifetime. Stable transmutation doped semiconductor material is obtained when irradiation and annealing conditions are coordinated. Factors such as quality of the thermal neutron flux, starting material quality, and annealing thermal cycle relationship are all very important in avoiding retention of large lattice damage and resistivity instability as well as providing for increased or improved minority carrier lifetime. According to the invention an annealing cycle has been established which has combined stable resistivity with high minority carrier lifetime. Several of these variables have not fully been explored as to the cause and effect upon minority carrier lifetime; however, holding such variables as neutron flux, and starting material constant permits comparative processing of rods side by side. The method according to the invention restores resistivity while increasing minority carrier lifetime as demonstrated by comparative processings.

Semiconductor materials which are capable of being uniformly doped through neutron bombardment comprise silicon or III–V compound or combinations thereof. For example, gallium arsenide or gallium phosphide when bombarded with neutrons produce initially unstable radio nuclides which decay into stable dopant elements as set forth in the table below:

TABLE I

| Semi-Conductor Layer | Radio Nuclide Forming Reaction | Radio Nuclide Half-Life | Type of Decay | Doping Element | Proportion of Doping (%) |
|---|---|---|---|---|---|
| GaAs | $Ga^{69}(n,\gamma)Ga^{70}$ | 21 min. | $\beta^-$ | $Ge^{70}$ | 11 ⎫ |
|  | $Ga^{71}(n,\gamma)Ga^{72}$ | 14.1 h | $\beta^-$ | $Ge^{72}$ | 20 ⎬ 31 |
|  | $As^{75}(n,\gamma)As^{76}$ | 26.7 h | $\beta^-$ | $Se^{76}$ | 69 ⎭ |
| GaP | $Ga^{69}(n,\gamma)Ga^{70}$ | 21 min. | $\beta^-$ | $Ge^{70}$ | 32 ⎫ |
|  | $Ga^{71}(n,\gamma)Ga^{72}$ | 14.1 h. | $\beta^-$ | $Ge^{72}$ | 61 ⎬ 93 |
|  | $P^{31}(n,\gamma)P^{32}$ | 14.2 h. | $\beta^-$ | $S^{32}$ | 7 |

Neutron bombardment of III–V semiconductor materials containing aluminum, gallium, nitrogen, phosphorus, arsenic, and/or antimony gives uniform dopant concentrations throughout the entire material.

The following examples relate to process according to the invention wherein the resistivity of neutron-doped semiconductor silicon is restored while minority carrier lifetime of the silicon is increased. Specifically, Tables II and III include comparative minority carrier lifetime data. Table II includes comparative samples which were not cooled according to the inventive method, while Table III includes samples which were cooled according to the method of invention. Data in Table II illustrates 23 samples having an average minority carrier lifetime of 93.9 and standard deviation of 29. The data of Table III which is in accordance with the invention presents 14 samples having an average minority carrier lifetime of 173 with standard deviation of 37.5. A comparison of the data of Table II and III show an 84% improvement in minority carrier lifetime figures according to the method of the invention.

EXAMPLES

Silicon rods which were exposed to the same radiation fluence were annealed at 825° C. for 3½ hours, however those rods having the lifetime figures as presented in Table II were removed from the annealing furnace and allowed to cool rapidly to ambient temperatures, while the rods having the lifetime figures as indicated in Table III were cooled from the 825° C. to below 300° C. at the rate of 1.1° to 2° C. per minute. The annealing furnaces were heated to 300° C. and allowed to stabilize before introduction of the silicon rods. The silicon rods were placed into clean quartz boats onto clean quartz racks for introduction into the annealing furnace. The annealing furnace with rods in place was maintained under argon atmosphere during the annealing process.

A standard tube furnace was equipped with a 4" diameter quartz tube purged with argon at a rate of 5–7 SCFH. The silicon rods were contained in a clean quartz boat. The rods were inserted into the hot zone of the furnace while it was at a temperature of 300° C. The following temperature program was then followed:

Heated from 300° to 825° C. at an average rate of 10°/minute
Held at 825° C. for 3.5 hours.
Cooled to 500° C. at an average rate of 2°/minute
Cooled from 500° C. at an average rate of 1.1°/minute
Pulled from hot zone and allowed to cool rapidly from 300° C. to room temperature.

TABLE II

| Example | Minority Carrier Lifetime* |
|---|---|
| 1 | 100 |
| 2 | 100 |
| 3 | 100 |
| 4 | 100 |
| 5 | 150 |
| 6 | 100 |
| 7 | 100 |
| 8 | 50 |
| 9 | 100 |
| 10 | 100 |
| 11 | 75 |
| 12 | 100 |
| 13 | 100 |
| 14 | 50 |
| 15 | 100 |
| 16 | 75 |
| 17 | 100 |
| 18 | 100 |
| 19 | 100 |
| 20 | 100 |
| 21 | 100 |
| 22 | 150 |
| 23 | 50 |

$n = 23$
$X = 93.9$
$\sigma = 29$

TABLE III

| Example | Minority Carrier Lifetime* |
|---|---|
| 1 | 190 |
| 2 | 100 |
| 3 | 180 |
| 4 | 200 |
| 5 | 180 |
| 6 | 200 |
| 7 | 200 |
| 8 | 100 |
| 9 | 200 |
| 10 | 180 |
| 11 | 200 |
| 12 | 120 |
| 13 | 200 |
| 14 | 180 |

$n = 14$
$X = 173$
$\sigma = 37.5$

Improvement of Table III data over the data of Table II was 84%.

Continuous belt-annealing furnace cool down procedures are also suitable according to the invention. This embodiment is shown in the following example:

EXAMPLE

An annealing furnace consisting of a continuous belt moving at a variable speed through a heating zone consisting of four resistance heaters whose temperature could be controlled independently was used for annealing irradiated silicon. The temperature profile was set so that when the silicon rods were moved on the belt at a rate of about 0.3 inches per minute they were given the following thermal treatment:

Between 700° and 750° C. for 50 minutes
Cooled from 700° to 400° C. at 1.7°/minute (average)
Cooled from 400° to 200° C. at 1.5°/minute Rods irradiated to the same level as those given in Tables II and III gave the following lifetime after annealing under the above conditions in the belt furnace:

| Example | Minority Carrier Lifetime* |
|---|---|
| 1 | 150 |
| 2 | 210 |
| 3 | 125 |
| 4 | 100 |
| 5 | 190 |
| 6 | 100 |
| 7 | 100 |
| 8 | 250 |
| 9 | 200 |
| 10 | 200 |
| 11 | 185 |
| 12 | 200 |
| 13 | 100 |
| 14 | 200 |
| 15 | 175 |
| 16 | 110 |

$n = 16$
$X = 162$
$\sigma = 50$

What is claimed is:

1. A method for restoring neutron-doped semiconductor material resistivity and increasing the minority carrier lifetime of said material through annealing, comprising: heating the material to an annealing temperature of around 600° C. or more but below the material melting temperature for a period of one-fourth hour to five hours or more; and cooling the heated material from the annealing temperature to ambient temperature of below about 300° C. at a cooling rate of from ¼° C. to about 4° C. per minute.

2. A method according to claim 1 wherein the semiconductor material is silicon.

3. A method according to claim 2 wherein the annealing temperature is from 600° C. to 1300° C.

4. A method according to claim 2 wherein the cooling rate is from ¼° C. to 3° C. per minute.

5. A method according to claim 2 wherein the annealing temperature is from 600° C. to 900° C.

6. A method according to claim 2 wherein the annealing period is from one-half to 4 hours.

7. A method for increasing the minority carrier lifetime of neutron transmutation doped semiconductor materials comprising heating the neutron transmutation doped semiconductor materials to an annealing temperature of from 600° to 1300° C. and maintaining the material at the annealing temperature for a period of one-fourth hour to at least 4 hours; and cooling the annealed material from the annealing temperature to ambient temperature at cooling rate of from ¼° C. to less than 4° C. per minute.

8. A method according to claim 7 wherein the semiconductor material is silicon.

9. A method according to claim 8 wherein the minority carrier lifetime is increased by 50% or more.

10. A method according to claim 8 wherein the cooling rate is from ¼° C. to 3° C. per minute.

* * * * *

UNITED STATES PATENT AND TRADEMARK OFFICE
CERTIFICATE OF CORRECTION

PATENT NO. : 4,135,951

DATED : January 23, 1979

INVENTOR(S) : Bobbie D. Stone

It is certified that error appears in the above—identified patent and that said Letters Patent are hereby corrected as shown below:

On the first page of this patent, the inventor's name, "Bobbie B. Stone" should read -- Bobbie D. Stone -- .

Signed and Sealed this

First Day of May 1979

[SEAL]

Attest:

RUTH C. MASON
Attesting Officer

DONALD W. BANNER
Commissioner of Patents and Trademarks